US00RE35353E

United States Patent [19]

Tokita et al.

[11] E Patent Number: Re. 35,353

[45] Reissued Date of Patent: Oct. 22, 1996

[54] PROCESS FOR MANUFACTURING A MULTI-LAYER LEAD FRAME

[75] Inventors: Masakuni Tokita; Akira Kobayashi; Shinichi Yamakawa; Mitsuharu Shimizu; Norihiro Masuda, all of Nagano, Japan

[73] Assignees: Shinko Electric Ind. Co, Ltd., Nagano, Japan; Intel Corporation, Santa Clara, Calif.

[21] Appl. No.: 314,311

[22] Filed: Sep. 28, 1994

Related U.S. Patent Documents

Reissue of:

[64] Patent No.: 5,231,756
Issued: Aug. 3, 1993
Appl. No.: 960,575
Filed: Oct. 13, 1992

U.S. Applications:

[63] Continuation of Ser. No. 701,182, May 16, 1991, abandoned.

[51] Int. Cl.[6] ..... B32B 31/18; H05K 3/36

[52] U.S. Cl. ..... 29/830; 29/25.01; 29/429; 156/261

[58] Field of Search ..... 29/827, 830, 831, 29/843, 429, 430, 25.01; 156/250, 252, 253, 256, 261, 516, 518, 530; 361/395, 398, 412, 417, 421; 357/80

[56] References Cited

U.S. PATENT DOCUMENTS

| | | | |
|---|---|---|---|
| 2,969,300 | 1/1961 | Franz | 156/261 X |
| 3,597,816 | 8/1971 | Zelenz | 156/261 X |
| 3,811,187 | 5/1974 | Diel et al. | 29/831 X |
| 4,079,511 | 3/1978 | Grabbe | 29/841 X |
| 4,279,682 | 7/1981 | Hamagami et al. | 156/367 |
| 4,581,096 | 4/1986 | Sato | 156/513 |
| 4,597,816 | 7/1986 | Barnhart | 156/263 |
| 4,683,023 | 7/1987 | Sokolovsky | 156/518 |
| 4,835,120 | 5/1989 | Mallik et al. | 437/224 X |
| 4,985,105 | 1/1991 | Masuda | 156/261 |
| 5,023,751 | 6/1991 | Stampfli | 29/831 X |

FOREIGN PATENT DOCUMENTS

| | | | |
|---|---|---|---|
| 2306680 | 8/1973 | Germany | 29/831 |

OTHER PUBLICATIONS

Patent Abstracts of Japan, vol. 010, No. 347, (E–457), Nov. 21, 1986 and JP–A–61,150,253 (Furukawa Electric Co., Ltd.), Jul. 8, 1986.

Proceedings of the 1989 Japan International Electronics Symposium, Apr. 26, 1989, NARA, Japan, pp. 221–229, D. Mallik et al., "Multi–Layer Molded Plastic Package".

*Primary Examiner*—Timothy V. Eley
*Attorney, Agent, or Firm*—Michael N. Meller

[57] ABSTRACT

A process for manufacturing a multi-layer lead frame for a semiconductor device comprises two metal plains being adhered to each other via an insulation piece. An insulation strip is punched to cut the insulation piece, which is preliminary adhered to a metal strip. The metal strip is then punched to cut and remove the metal plane, which is then laminated and heat-pressed to another metal strip. After completely adhered, the other metal strip is punched to remove a multi-layer lead frame.

12 Claims, 5 Drawing Sheets

PROCESS FOR MANUFACTURING A MULTI-LAYER LEAD FRAME

Matter enclosed in heavy brackets [ ] appears in the original patent but forms no part of this reissue specification; matter printed in italics indicates the additions made by reissue.

This application is a continuation of application Ser. No. 701,182, filed May 16, 1991, now abandoned.

BACKGROUND OF THE INVENTION

1. Field of the Invention

This invention relates to a process for manufacturing a lead frame, more particularly to a process for manufacturing a multi-layer lead frame having at least one metal plate or plane, hereinafter referred to as "metal plane" which is used for a semiconductor device.

2. Related Art

A plastic package, whose speed and heat-radiation characteristics are as good as those of a ceramic package, has recently been developed. In addition, in place of a conventional single-layer lead frame, a multi-layer plastic lead frame for a semiconductor device has also been developed.

Such a multi-layer lead frame comprises at least one metal plane connected via an insulative layer to the bottom surfaces of inner leads. Using such a multi-layer lead frame, it will be possible to mount a relatively power-consumable semiconductor chip on the metal plane, due to a good heat radiation capacity of the metal plane. Also, the metal plane can be used as a ground layer or a power supply layer to improve the electrical characteristics of the semiconductor device.

FIG. 10 shows a conventionally known multi-layer lead frame which comprises three layers, i.e., a signal layer (i.e., lead frame 12) and two metal planes. i.e., a power supply metal plane 20 and a ground metal plane 62, which are laminated via insulative tapes 42a and 17b made of heat-resistant material including, such as a polyimide.

Using such a multi-layer lead frame, it would be possible to prevent a so-called cross talk which might be generated between signal lines and also possible to reduce the capacitance between the lines or inductance.

As shown in FIG. 10, in order to manufacture the above-mentioned multi-layer lead frame, at the first stage, a lead frame 12, a power supplying metal plane 20, a ground metal plane 62, and insulative tape pieces 42a and 42b each having respective surfaces providing with adhesive layers must individually be made. Then, these individual pieces must be positioned by using a special instrument, such as an image reader (not shown), and then heat-pressed to laminate and adhere them together.

However, in the above mentioned manufacturing process, it has been very troublesome and laborious work to position and laminate the five layers including the insulative tape pieces 42a and 42b by using the image reader. It also requires a lot of time and, therefore, an effective production rate would not be expected. In addition, when these pieces are released or disengaged from the gripping means after the pieces are gripped by the gripping means and laminated, the laminated pieces might be moved slightly and, therefore, a precise laminated multi-layer lead frame might not be obtained.

The multi-layer lead frame should originally have a good quality for multi-pin and, therefore, inner leads thereof are usually very dense. Thus, even a slight aberration might cause a disconnection between the terminals of the power supply plane 20 or the ground plane 32 and the corresponding inner leads of the lead frame 10.

SUMMARY OF THE INVENTION

An object of the present invention is to provide a process for manufacturing a multi-layer lead frame, in which the lead frame base or the metal planes can be precisely and effectively positioned.

According to this invention, there is provided a process for manufacturing a multi-layer lead frame for a semiconductor device comprising a lead frame body and at least one metal plane adhered to lead frame body by means of an insulation tape piece, said process comprising the following steps of: forming a lead frame strip and at least one metal plane strip from metal strips, said lead frame strip comprising a plurality of said lead frame bases longitudinally and continuously arranged, said metal plane strip comprising a plurality of said metal planes longitudinally and continuously arranged and connected to a second supporting frame via second connecting portions, and each of said first and second supporting frames having positioning means, such as, guide holes; forming at least one insulation tape strip from a resin strip providing adhesive layers on its respective surfaces, said insulation tape strip comprising a plurality of said insulation tape pieces longitudinally and continuously arranged and connected to a third supporting frame via third connecting portions, said third supporting frame having positioning means, such as, guide holes; positioning said insulation tape strip with respect to said metal plane strip by their positioning means; punching said insulation tape strip to cut and remove at least one of said the insulation tape pieces from said third connecting portions and preliminary adhering said insulation tape piece to at least one of said metal planes of said metal plane strip; positioning said metal plane strip with respect to said lead frame strip; punching said metal plane strip to cut and remove said at least one metal plane from said second connecting portions and laminating said metal plane to heat-press and completely adhere it to said at least one lead frame base of said lead frame strip; and punching said lead frame strip to cut and remove said at least one lead frame from said first connecting portions and separate it from its supporting frame.

Thus, according to the present invention, the lead frame base or the metal planes can be precisely and effectively positioned, since the positioning of the lead frame strip and the metal plane strip can be easily and precisely performed.

DESCRIPTION OF THE PREFERRED EMBODIMENTS

Figure 1:
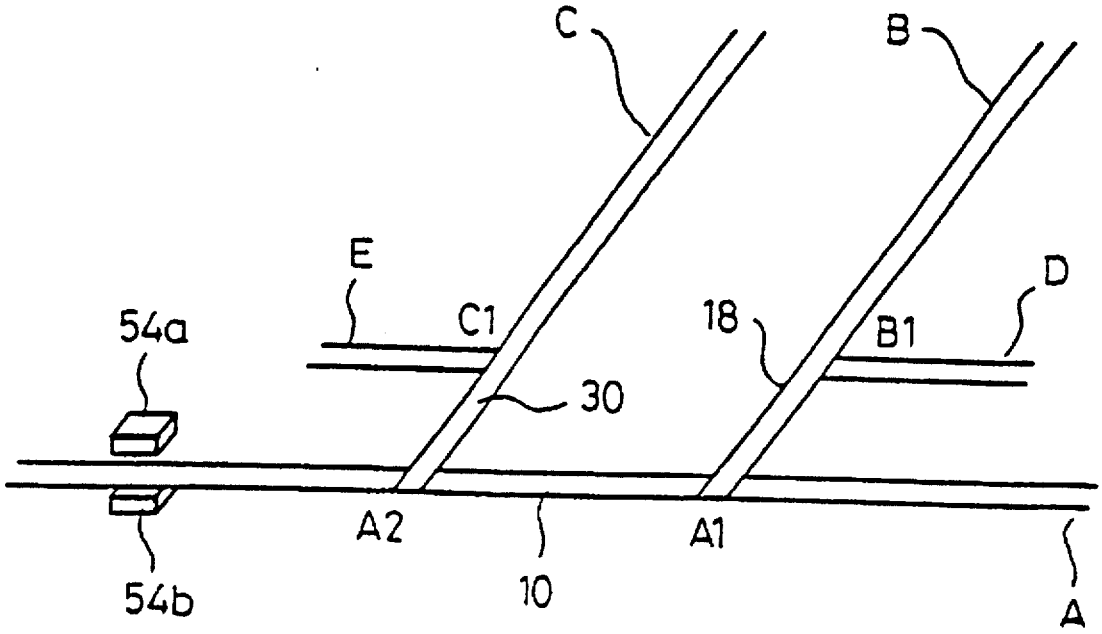
FIG. 1 is a schematic view illustrating a manufacturing process of the multi-layerd lead frame.

Referring now to the drawings, FIGS. 1–8 show a preferred embodiment of a process for manufacturing a multi-layer lead frame according to the present invention.

A multi-layer lead frame can be manufactured by a process as described below with reference to FIG. 1, in which, A is a line of process for manufacturing a lead frame strip 10, B is a line of process for manufacturing a power supply plane strip 18, and C is a line of process for manufacturing a ground plane strip 30. D and E are also lines of process for providing insulation tapes.

Figure 2:
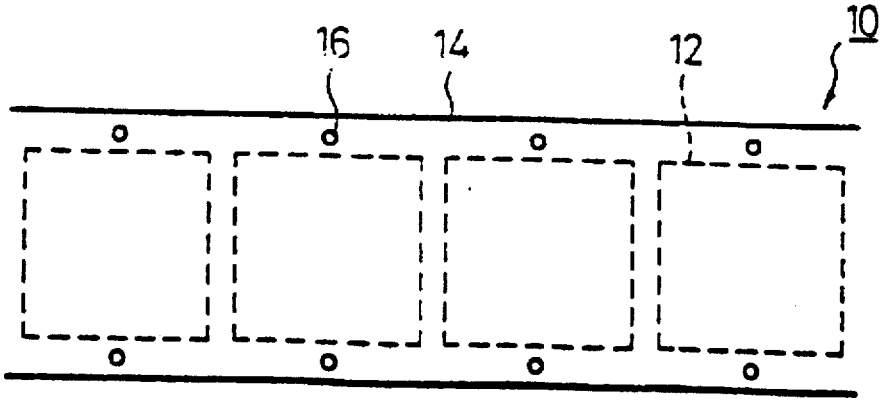
FIGS. 2, 3, 4 and 5 are plan views of the lead frame strip, the power supply plane, the ground plane, and the insulation tape strip, respectively.

In the process line A, a metal strip 10 is forwardly fed through several metal molds (not shown). Along these molds the lead frame strip 10 is formed in a conventionally known manner. Thus, as schematically shown in FIG. 2, obtained is a lead frame strip 10 comprising a support frame 14 and a plurality of lead frames 12 longitudinally and continuously arranged and connected to each other by means of connecting portions. The support frame 14 is provided with a plurality of regularly arranged guide holes 16 which cooperate with guide means (not shown) for feeding this lead frame strip 10 forwardly through the metal molds.

Figure 3:
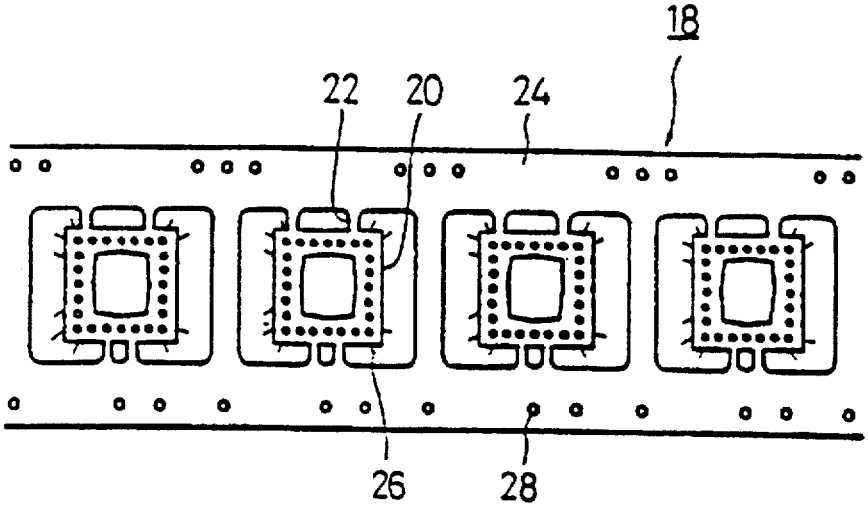

The process line B intersects perpendicularly with the process line A at a position A1 downstream of the working stations for entirely forming all of the patterns of the lead frame strip 10. In the process line B, another metal strip is fed forwardly through several metal molds (not shown) to form a power supply plane strip 18 which comprises, as shown in FIG. 3, a plurality of power supply planes 20 longitudinally and continuously arranged and connected to a supporting frame 24 by means of connecting portions 22. A reference numeral 26 indicates terminals which are protruded from the power supply plane 20. Such terminals 26 are connected to predetermined power supply leads of the lead frame 12 when the power supply plane 20 is laminated to the lead frame 12. A reference numeral 28 indicates positioning guide holes which are used for feeding the power supply plane strip 18 through the metal molds, as mentioned above.

Figure 4:
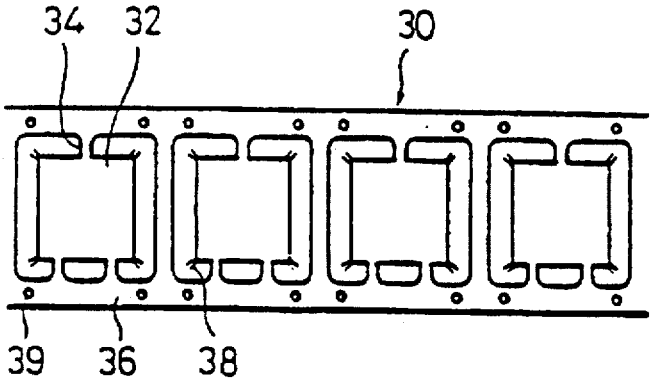

The process line C also intersects perpendicularly with the process line A at a position A2 downstream of the intersection with the process line B. In the same manner as the above, in the process line C, a still another metal strip is fed forwardly through several metal molds (not shown) to form a ground plane strip 30 which comprises, as shown in FIG. 4, a plurality of ground planes 32 longitudinally and continuously arranged and connected to a supporting frame 36 by means of connecting portions 34. A reference numeral 38 indicates terminals which are protruded from the ground plane 32. Such terminals 38 are connected to predetermined ground leads of the lead frame 10, when the ground plane 32 is laminated to the lead frame 10. A reference numeral 39 indicates positioning guide holes which are used for feeding the ground plane strip 30 through the metal molds, as mentioned above.

The process line D for forming a first insulation tape strip 40 is arranged to intersect perpendicularly with the process line B at a position downstream of a final step for forming the power supply plane strip 18 in the process line B.

Figure 5:
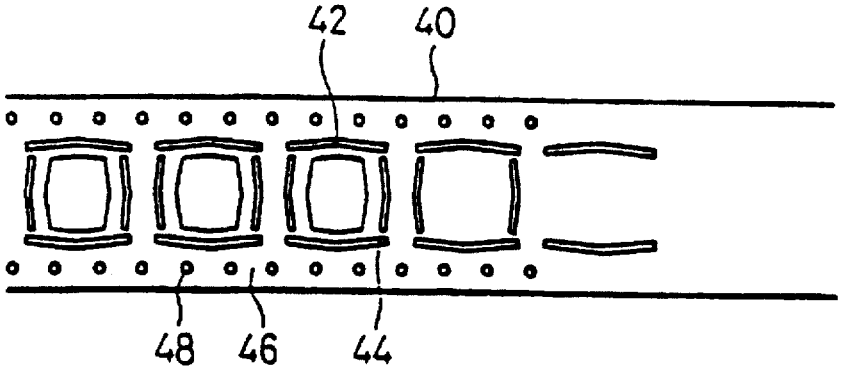

In this process line D, a resin strip is fed forwardly through several metal molds (not shown) to form a frame-like insulation tape strip 40 which comprises, as shown in FIG. 5, a plurality of insulation tape pieces 42 longitudinally and continuously arranged and connected to a supporting frame 46 by means of connecting portions 44. Such an insulation tape piece 42 is used for adhering the lead frame 12 to the power supply plane 20. A reference numeral 48 indicates guide holes. The above-mentioned insulation tape strip 40 may be a so-called double sided adhesive tape comprising a heat-resistant resin sheet made of, such as, a polyimide and having respective surfaces to which suitable resin paste comprising, such as, a thermosetting resin contained in any solution media is coated and dried to form adhesive layers.

The insulation tape piece 42 of the first insulation tape strip 40 is cut from the connecting portion 44 at the intersection of the process line B and provisionally adhered to the bottom surface of the power supply plane 20 (strip 18) at a predetermined position.

Figure 6:
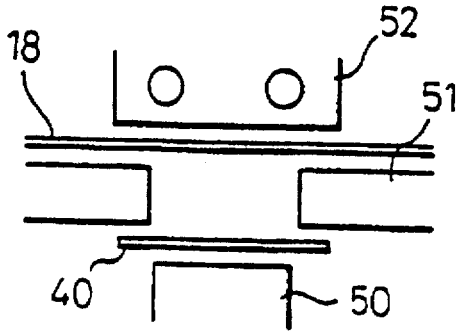
FIGS. 6, 7, 8 and 9 are schematic cross-sectional views of heat pressing devices; and, FIG. 10 is an exploded view of a multi-layer lead frame known in the prior art.

FIG. 6 shows an example of the heat press apparatus which comprises a cutting punch 50, a die 51, and a heater block 52. When the insulation tape strip 40 is positioned by means of the above-mentioned guide holes 48 and fed to a predetermined position between the cutting punch 50 and the die 51, the cutting punch 50 is moved upward to cut the connecting portions 44, so that the insulation tape strip 40 is cut into the individual insulation tape piece 42, which is then heat-pressed against the power supply plane 20 (strip 18) provisionally heated by the heater block 52. The heat-pressing in this process is conducted at the temperature of, such as 180° C., which is sufficient to soften the adhesion of the insulation tape piece 42 to be adherent, but not to completely harden the thermosetting adhesive.

After the insulation tape pieces 42 are removed from the insulation tape strip 40, the supporting frame 46 is wound onto an appropriate reel (not shown).

The pressing surface of the cutting punch 50 may be provided with some suction holes communicated to any vacuume means (not shown) for sucking to hold the cut insulation tape piece 42 and simultaneously to press the same against the power supply plane 20 (strip 18). Thus, the insulation tape piece 42 is held stably against the power supply plane 20 (strip 18).

The process line E for forming a second insulation tape strip 40 is arranged to intersect perpendicularly with the process line C at a position downstream of a final step for forming the ground plane strip 30 in the process line C. In this process line E, a resin strip is fed forwardly through several metal molds (not shown) to form a frame-like insulation tape strip 40 in the same manner as the above. Thus, the insulation tape piece 42 is used for preliminary adhering the ground plane 32 to the power supply plane 20.

The the second insulation tape strip 40 is cut from the connecting portion 44 into the insulation tape piece 42 at the intersection of the process line C. The insulation tape piece 42 is provisionally adhered to the bottom surface of the ground plane 32 at a predetermined position.

After the first and second insulation tape strips 40 are cut into the individual insulation tape pieces 42 and heat-pressed against the power supply plane 20 (strip 18) and the ground plane 32 (strip 30), respectively, the lattters are then further fed to the intersections with the process line A.

Figure 7:
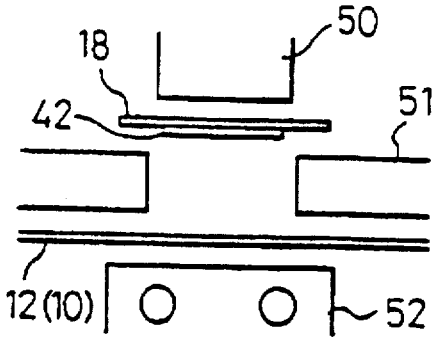

FIG. 7 shows an example of a heat press apparatus which is substantially the same as that shown in FIG. 6, except that the cutting punch 50 is arranged upside and the die 51 and the heater block 52 are arranged downside. When the power supply strip plane 18, to which the insulation tape piece 42 is preliminary adhered, is positioned by means of the above-mentioned guide holes 28 and fed to a predetermined position A1 (FIG. 1) between the cutting punch 50 and the die 51, the cutting punch 50 is moved downward to cut the connecting portions 22, so that the power supply plane strip 18 is cut into the individual power supply strip which is then heat-pressed against lead frame 12 provisionally heated by the heater block 52.

Figure 8:
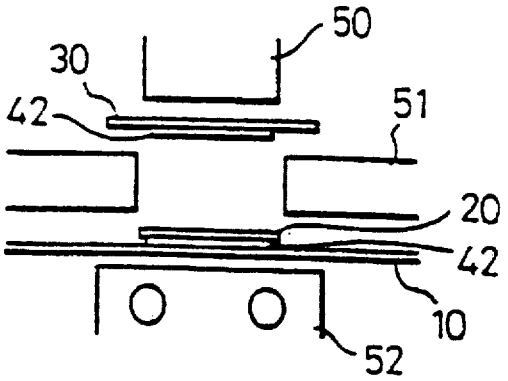

Thus, the lead frame strip 10, to which the power supply plane 20 adhered by means of the insulation tape piece 42, is further fed forwardly and, at the intersection A2 (FIG. 1) of the process line C, the ground plane 32, to which the first insulation tape piece 42 is provisionally adhered, is then provisionally adhered to the power supply plane 20 by means of the second insulation tape piece 42, in the same manner as mentioned above. That is to say, as shown in FIG. 8, when the lead frame strip 10 and the ground plane strip 30 are positioned to each other by means of the respective guide holes and fed forwardly to the intersection A2 of the process line C, the cutting punch 50 is lowered to cut the ground plane strip 30 from the connecting portions 34 into the individual ground plane 32, which is then heat-pressed against the power supply plane 20 on the lead frame strip 10 provisionally heated by the heater block 52 to soften the adhesive of the insulation tape piece 42 to preliminary adhere the ground plane 32 against the power supply plane 20.

Thus, the lead frame 12, to which the power supply plane 20 and the ground plane strip 32 are laminated, is further fed forwardly along the process line A and is further heated and pressed by upper and lower heater blocks 54a and 54b. Thus, the adhesive tapes or layers of the insulation tape pieces 42 are suitably thermoset and, therefore, a stable main or complete adhering is thus conducted.

The respective terminals of the power supply plane 20 and the ground plane strip 32 are connected to the corresponding leads of the lead frame 12 by a spot welding or the like.

According to the above-mentioned embodiment, by synchronizing operating the respective process lines A, B, C, D and E, the lead frame 12, the first and second insulation tape pieces 42, the power supply plane 20 and the ground plane 32 can automatically be formed. Also, the provisional adhering, the heat-pressing and the positioning of the insulation tape pieces 42 can automatically be conducted. A multi-layer lead frame of this invention can thus be automatically manufactured throughout the whole steps.

However, such a synchronizing operation can be partly conducted. For example, tile operations for forming and heat-pressing of the power supply plane strip 18 and the first insulation tape 42 are synchronized to each other and, on the other hand, the operations for forming and heat-pressing of the ground plane strip 30 and the second insulation tape 42 are synchronized to each other. Laminating and heat-pressing of the power supply plane 20, to which the insulation tape 42 is attached, the ground plane 32, and the lead frame strip 10 can be synchronizing operated as mentioned above in a separate process.

Figure 9:
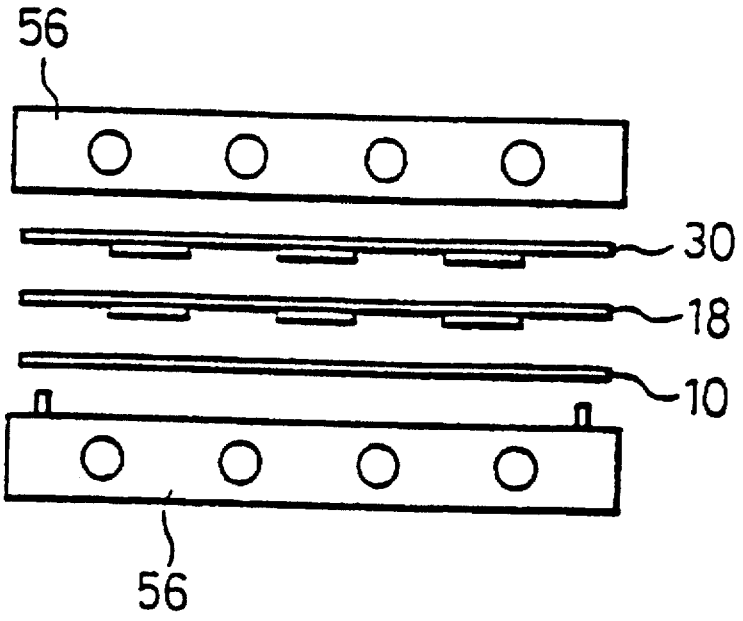
Figure 10:
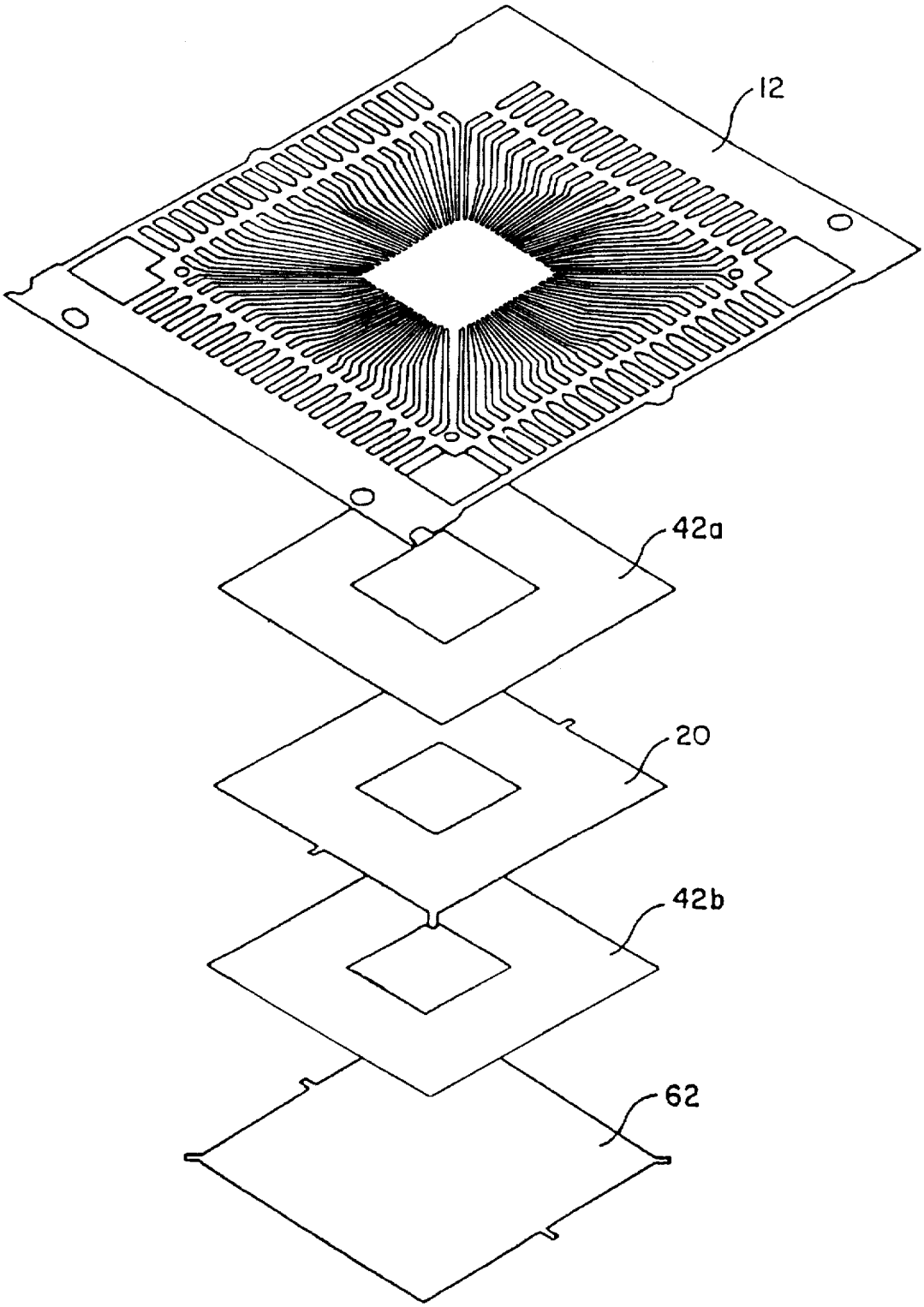
FIG.10 PRIOR ART

FIG. 9 shows another embodiment of a laminating process. In this embodiment, the power supply plane strip 18, to which the first insulation tape pieces 42 are adhered, and the ground plane 32, to which the second insulation tape pieces 42 are adhered, are not cut into individual planes. But these strips 18 and 30 are themselves positioned by any positioning means, such as pilot pins, and superimposed on the lead frame strip 10, so that they are heat-pressed together by means of upper and lower heater blocks 56 and 56 to thermoset the adhesive tape layers of the first and second insulation tape pieces 42. The power supply plane strip 18 and the ground plane strip 30 are thereafter cut into individual planes 20 and 32 from the frame portions thereof. The connecting portions 22 and 34 may be provided at the bases thereof with V-shaped notches or the like extending to the direction of thickness so as to make it easy to cut the connecting portions.

In this embodiment, the first insulation tape piece 42 for adhering the power supply plane 20 to the lead frame 12 may be provisionally adhered to the lead frame strip 10. On the other hand, the second insulation tape piece 42 for adhering the ground plane 32 to the power supply plane 20 may be provisionally adhered to the power supply plane strip 18.

Although, in the above mentioned embodiments, a multi-layer lead frame comprises three layers, i.e., the lead frame, the power supply plane and the ground plane, this invention is also applicable to any other multi-layer lead frames comprising, such as, two layers, i.e., a lead frame and a metal plane. In this case, the metal plane may be a power supply plane, a ground plane, or a radiation/stage plane which is not electrically connected to the lead frame.

A multi-layer lead frame thus obtained according to the present invention may, of course, be comprised of four or more layers.

It should be understood by those skilled in the art that the foregoing description relates to only preferred embodiments of the disclosed invention and that various changes and modifications may be made in the invention without departing form the spirit and scope thereof.

We claim:

1. A process for manufacturing a multi-layer lead frame for a semiconductor device comprising a lead frame body and at least one metal plane adhered to said lead frame body by means of an insulation tape piece, said process comprising the following steps of:

forming a lead frame strip and at least one metal plane strip from metal strips, said lead frame strip comprising, a first supporting frame and a plurality of lead frame base longitudinally and continuously arranged, said metal plane strip comprising a plurality of said metal planes longitudinally and continuously arranged and connected to each other by connecting portions, and supported by said first supporting frame and having positioning means;

forming at least one insulation tape strip from a resin strip providing adhesive layers on its respective surfaces, said insulation tape strip comprising a plurality of said insulation tape pieces longitudinally and continuously arranged and connected to another supporting frame via other connecting portions, said other supporting frame having positioning means;

positioning said insulation tape strip with respect to said metal plane strip by their positioning means;

punching said insulation tape strip to cut and remove at least one of said insulation tape pieces from said other connecting portions and provisionally adhering said insulation tape piece to at least one of said metal planes of said metal plane strip;

positioning said metal plane strip with respect to said lead frame strip; and punching said metal plane strip to cut and remove said at least one metal plane from said connecting portions and laminating by heat-pressing in order to completely adhere to said metal plane to said at least one lead frame base of said lead frame strip.

2. A process as set forth in claim 1, wherein said metal plane comprises two layers consisting of a power supply plane and a ground plane.

3. A process as set forth in claim 2 further comprising the steps of:

punching a first insulation tape strip to cut and remove at least one of first insulation tape pieces and provisionally adhering said first insulation tape piece to at least one power supply plane of a power supply plane strip; and, punching a second insulation tape strip to cut and remove at least one of second insulation tape pieces and provisionally adhering said second insulation tape piece to at least one ground plane of the ground plane strip.

4. A process as set forth in claim 3 further comprising the steps of:

punching said power supply plane strip to cut and remove said at least one power supply plane and laminating by heating-pressing said power supply plane to provisionally adhere said power supply plane to said at least one lead frame base of said lead frame strip; and punching said ground plane strip to cut and remove said at least one ground plane and laminating by heat-pressing said ground plane to said power supply plane already adhered to said lead frame base in order to adhere said ground plane to said power supply plane and said lead frame base.

5. A process as in claim 1 wherein said positioning means comprises guide holes.

6. A process for manufacturing a multi-layer lead frame for a semiconductor device comprising a lead frame body and at least one metal plane adhered to said lead frame body by means of an insulation tape piece, said process comprising the following steps of:

forming a lead frame strip and at least one metal plane strip from metal strips, said lead frame strip comprising a plurality of lead frame bases longitudinally and continuously arranged, said metal plane strip comprising a plurality of said metal planes longitudinally and continuously arranged and connected to a supporting frame via connecting portions, and said supporting frame having positioning means:

forming insulation tape strips from resin strips each providing adhesive layers on its respective surfaces, each of said insulation tape strips comprising a plurality of said insulation tape pieces longitudinally arranged and continuously connected to another supporting frame via other connecting portions, said other supporting frame having positioning means:

positioning said lead frame strip, said metal plane strip, and said insulation tape strips, respectively, by said positioning means;

punching said insulation tape strips to cut and remove the insulation tape pieces from said another connecting portions and provisionally adhering said insulation tape pieces to predetermined positions of said lead frame strip and/or said metal plane strip;

positioning and laminating by heat-pressing said lead frame strip and said metal plane strip to completely adhere them together via said insulation tape pieces; and separating said metal planes from their supporting frames.

7. A process as set forth in claim 6, wherein said metal plane comprises two layers consisting of a power supply plane and a ground plane, and said lead frame body, said power supply plane and said ground plane are laminated in this order.

8. A process in claim 6 wherein said positioning means comprises guide holes.

9. A process for manufacturing a multi-layer lead frame for a semiconductor device comprising at least two metal planes adhered to each other by means of an insulation tape piece, said process comprising the following steps of:

forming at least two metal strips each comprising a plurality of said metal planes longitudinally and continuously arranged and having positioning means;

forming at least one insulation tape strip providing adhesive layers on its respective surfaces, said insulation tape strip comprising a plurality of said insulation tape pieces longitudinally and continuously arranged an having positioning means;

positioning said insulation tape strip with respect to a first metal plane strip by their positioning means; punching said insulation tape strip to cut and remove said insulation tape piece and provisionally adhering said insulation tape piece to said first metal plane strip;

positioning said first metal plane strip with respect to a second metal plane strip;

punching said first metal plane strip to cut and remove a first metal plane and laminating by heat-pressing to completely adhere said first metal plane to said second metal plane strip; and, punching said second metal plane strip to cut and remove a second metal plane.

10. A process as in claim 9 wherein said positioning means comprises guide holes.

11. A process for manufacturing a multi-layer lead frame for a semiconductor device comprising at least two metal planes adhered to each other by means of an insulation tape piece, said process comprising the following steps of:

forming at least two metal strips each comprising a plurality of said metal planes longitudinally and continuously arranged and having positioning means;

forming at least one insulation tape strip providing adhesive layers on is respective surfaces, said insulation tape strip comprising a plurality of said insulation tape pieces longitudinally and continuously arranged and having positioning means;

positioning said insulation tape strip with respect to a first metal plane strip by their positioning means;

punching said insulation tape strip to cut and remove said insulation tape piece and provisionally adhering said insulation tape piece to said first metal plane strip;

positioning said first metal plane strip with respect to a second metal plane strip; and, laminating by heat-pressing said first metal plane strip to said second metal plane strip to completely adhere them to each other.

12. A process as in claim 11 wherein said positioning means comprises guide holes.

* * * * *